United States Patent [19]

Buck

[11] 4,165,147

[45] Aug. 21, 1979

[54] PRINTED CIRCUIT BOARD JACK

[75] Inventor: Josef J. Buck, Minneapolis, Minn.

[73] Assignee: Magnetic Controls Company, Minneapolis, Minn.

[21] Appl. No.: 912,196

[22] Filed: Jun. 5, 1978

[51] Int. Cl.[2] ........................ H01R 17/18; H05K 1/10

[52] U.S. Cl. .............................. 339/182 R; 339/17 C; 339/217 J

[58] Field of Search ................. 339/17 C, 182 R, 183, 339/217 S, 217 J, 221 M

[56] References Cited

U.S. PATENT DOCUMENTS

| | | | |
|---|---|---|---|
| 3,744,009 | 7/1973 | Teagno et al. | 339/17 C X |
| 4,002,399 | 1/1977 | Deitch et al. | 339/182 R X |
| 4,037,913 | 7/1977 | Deitch et al. | 339/182 R |
| 4,119,359 | 10/1978 | Schultz | 339/217 J X |

FOREIGN PATENT DOCUMENTS

| | | | |
|---|---|---|---|
| 974786 | 11/1964 | United Kingdom | 339/182 R |

*Primary Examiner*—E. F. Desmond
*Attorney, Agent, or Firm*—Dorsey, Windhorst, Hannaford, Whitney & Halladay

[57] ABSTRACT

An electrical jack suitable for direct connection to a printed circuit board which has an elongated nonconductive housing with a cylindrical opening for insertion of a plug and at least two wrap-around contact assemblies extending generally transverse to the cylindrical opening. Each contact assembly including a first cantilevered contact member having a free end movable between a first and second position in response to insertion and removal of the plug. Each contact assembly further includes a second cantilevered contact member having a free end adapted for electrical engagement with the free end of the first contact member. The respective contact portions of the free ends of the first and second contact members are disposed at an angle with respect to the direction of movement of the contact portions into and out of electrical engagement with each other to increase the wiping action therebetween.

12 Claims, 7 Drawing Figures

PRINTED CIRCUIT BOARD JACK

BACKGROUND OF THE INVENTION

The present invention relates generally to the field of electrical connectors and jacks and, more specifically, to an improved electrical jack adapted for direct connection to a printed circuit board. Such jack is adapted for use primarily in the communications industry, however, it is contemplated that it will have application in various other fields such as the audio industry and the like as well.

Many jacks in the prior art have included a lamination of a number of spring metal contacts separated by insulators and mounted on one end of a metal frame. The other end of the frame forms the entrance end and accepts a plug. The entrance end is then adapted to be mounted in a panel. The most common example of this type of jack is in the telephone industry.

In addition to the above described jacks, the prior art includes a jack of the type described in British Pat. No. 974,786. Such jack includes a body portion formed of insulating material and three transverse slots extending across such body portion to seat a corresponding number of wrap-around contact members. Each of these contact members consists of a movable contact element and a corresponding stationary contact element having soldering lugs extending from the bottom of the jack for appropriate connection to the desired circuitry. This jack is a panel-mount type jack. Each of the stationary contact members of this jack consists of an "L" shaped contact, one leg of which extends downwardly through the bottom of the jack. The other leg extends generally horizontally with respect to the plug for electrical contact with the movable contact element. The contact surface of this latter end is generally perpendicular to the movement of the movable contact member. Because of this structure, the "wipe" or wiping action between the contact elements in this jack is limited.

As the art has been refined, jacks have been produced in smaller configurations, commonly called miniature jacks in the industry. These jacks are mounted in close proximity to each other on jack panels and are adapted generally for direct connection to a printed circuit board. Jacks of this type are illustrated and described in U.S. Pat. Nos. 4,002,399 and 4,037,913.

SUMMARY OF THE INVENTION

In general, the jack of the present invention is larger than the miniature jacks described above in that they have a 0.625 inch center-to-center dimension when disposed adjacent to each other. It is adapted for direct connection to a printed circuit board and includes means for improving the wiping action between the various contact elements to insure greater reliability. The jack of the present invention also includes an improved contact member for making contact with the tip portion of the inserted plug and improved stress relief means to reduce the stress caused by insertion of the plug into the jack.

More specifically, the jack of the present invention includes a generally rectangular body of molded insulated material with a cylindrical opening therein for accepting a plug member commonly of the tip, ring and sleeve type. The jack includes a plurality of wrap-around spring contact assemblies lying in corresponding transverse slots or openings within the body and extending across the path of the plug as it is inserted into the jack. These contact assemblies include a first or movable element adapted for electrical engagement with portions of the plug and movable into and out of electrical contact with a corresponding second or generally stationary contact element. The stationary contact element is mounted to the jack housing on the side of the cylindrical opening opposite the side on which its corresponding movable contact element is mounted. Both the movable and stationary contact elements include contact lugs at their lower ends which extend past the bottom surface of the body for direct connection to a printed circuit board.

The upper contact portions of the stationary contact elements are disposed at a generally upward angle relative to the horizontal to make electrical contact with the corresponding movable contact element. This particular structure and the relationship between the two contact elements provide increased wiping action between the contact members while at the same time maintaining sufficient contact force. The increased wiping action improves the reliability of the jack and reduces the surface contamination at the contact points.

The jack of the present invention further includes a plurality of stress relief posts extending from the bottom surface of the jack and adapted for insertion into the corresponding openings in the printed circuit board. These posts function to reduce or eliminate stresses on the printed circuit board connector lugs resulting from insertion and withdrawal of the plug member.

The spring contact elements are retained in slots formed in the body side walls by barbed tabs. Each of the contact springs is uniquely designed to provide sufficient contact force to retain the jack plug upon insetion, while also providing sufficient resiliency to enable easy and repeated insertion and withdrawal of the plug. The improved jack also includes a unique contact member for contacting the tip portion of the plug.

Accordingly, it is a primary object of the present invention to provide an improved jack adapted for direct connection to a printed circuit board.

Another object of the present invention is to provide an improved electrical jack having means for increasing the wiping action between corresponding contact members to improve reliability of the jack.

A further object of the present invention is to provide an electrical jack with an improved tip spring contact element.

Still a further object of the present invention is to provide improved stress relief means.

These and other objects of the present invention will become apparent with reference to the drawings, the description of the preferred embodiment and the appended claims.

DESCRIPTION OF THE PREFERRED EMBODIMENT

Figure 1:
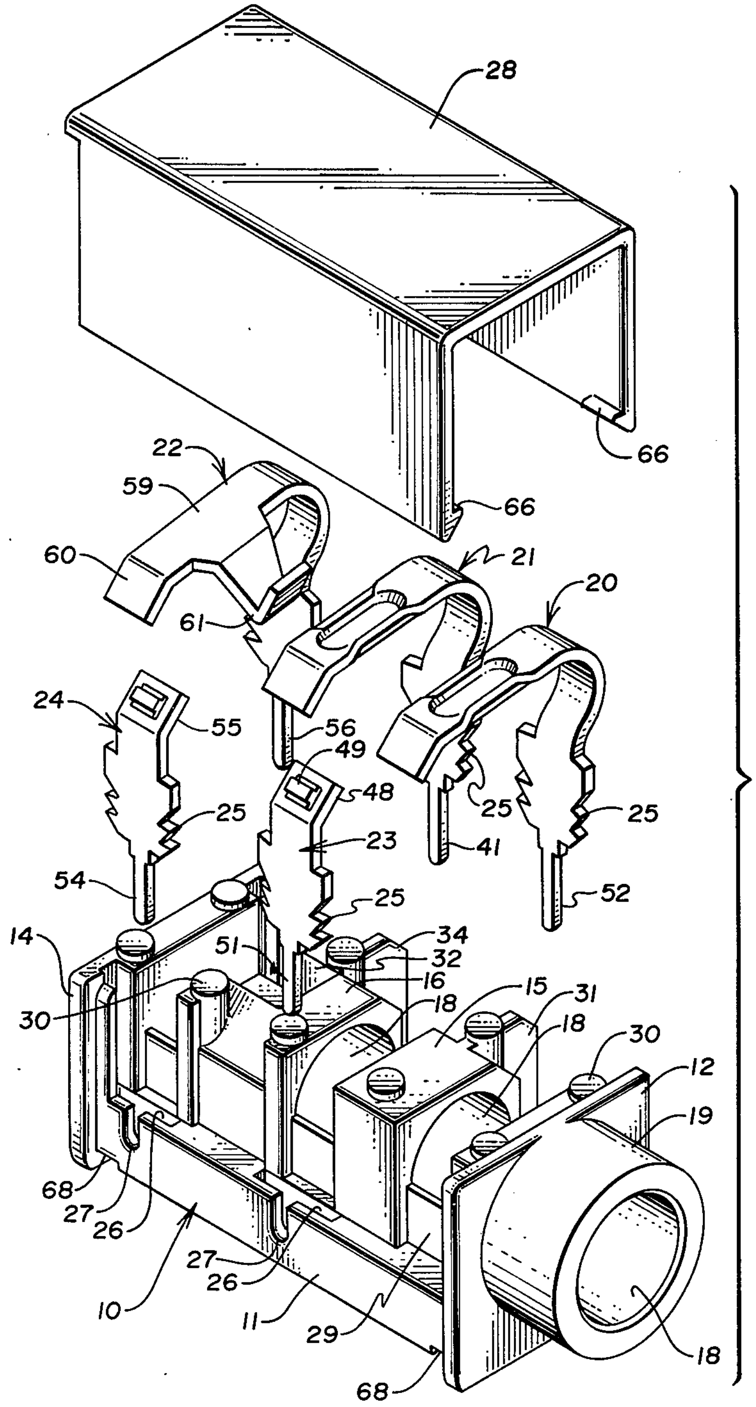
FIG. 1 is an exploded pictorial view of the improved jack of the present invention showing the spring contact elements and the cover separated from the body portion or housing.

Reference is first made to FIG. 1 which is a pictorial view of the jack of the present invention with the various structural parts separated from the elongated non-conductive body or housing portion 10. The body 10 includes a lower base portion 11, forward and rearward walls 12 and 14, and a pair of intermediate walls 15 and 16. The body 10 also includes a cylindrical opening 18 extending substantially through the jack along a longitudinal axis of the housing. The cylindrical opening 18 is defined in part by a forwardly disposed sleeve portion 19, a semicylindrically shaped channel portion 29 extending the length of the jack and portions of the intermediate walls 15 and 16.

A plurality of spring contact assemblies extending generally transverse to the opening 18 are adapted for insertion into portions of the base 11 for retention therein by appropriate means. Two of these contact assemblies include a first or generally movable contact element 21 and 22, and a corresponding second or generally stationary element 23 and 24. One of these contact assemblies consists only of the movable contact element 20. Each of the contact members 20–24 includes an intermediate or shaft portion containing a plurality of barbs 25 for insertion into and retention within corresponding slots 26 in the base 11. As shown, the members 20–24 are positioned such that the members 21 and 22 are adapted for electrical connection with their corresponding stationary members 23 and 24.

With reference to FIGS. 1, 2, 3 and 5, the base portion 11 is shown as being integrally joined with the semi-cylindrically shaped channel portion 29 to define a portion of the cylindrical opening 18. The channel portion 29 extends from the rearward face of the forward wall 12 to the forward face of the rearward wall 14 to totally separate the opening 18 from the bottom of the jack. This helps in preventing contamination of the contact elements during soldering or flushing of the printed circuit board. The opening 18 is further defined by the sleeve portion 19 which extends forward of the front face of the forward wall 12 and the intermediate walls 15 and 16 positioned in spaced relationship between the forward wall 12 and the rearward wall 14.

Figure 2:
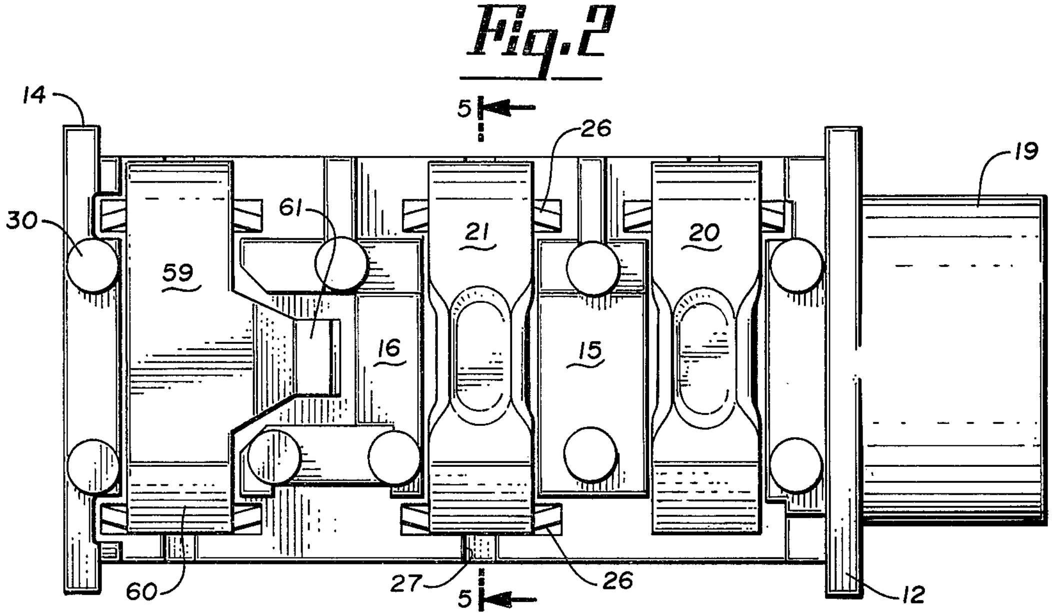
FIG. 2 is a top plan view of the improved jack of the present invention with the cover portion removed.

As illustrated best in FIGS. 1 and 2, both of the intermediate walls 15 and 16 include sections integrally joined with the base 11 and a portion of the channel 29 and a narrower section 31 extending outwardly to one of the side edges of the base 11. The intermediate wall 16 also includes a recessed area 32 which, as will be discussed below, facilitates the tip spring contact member 22. Generally transverse openings are disposed between the rear face of the forward wall 12 and the intermediate wall 15, between the intermediate walls 15 and 16 and between the intermediate wall 16 and the forward face of the rear wall 14 for respective positioning of the spring contact elements 20, 21 and 22. As illustrated best in FIG. 3, the spring contact element 20 is adapted for electrical connection with the sleeve portion 35, the contact element 21 is adapted for electrical connection with the ring portion 36 and the contact element 22 is adapted for electrical connection with the tip portion 38 of a plug member 39 when inserted into the opening 18.

Figure 5:
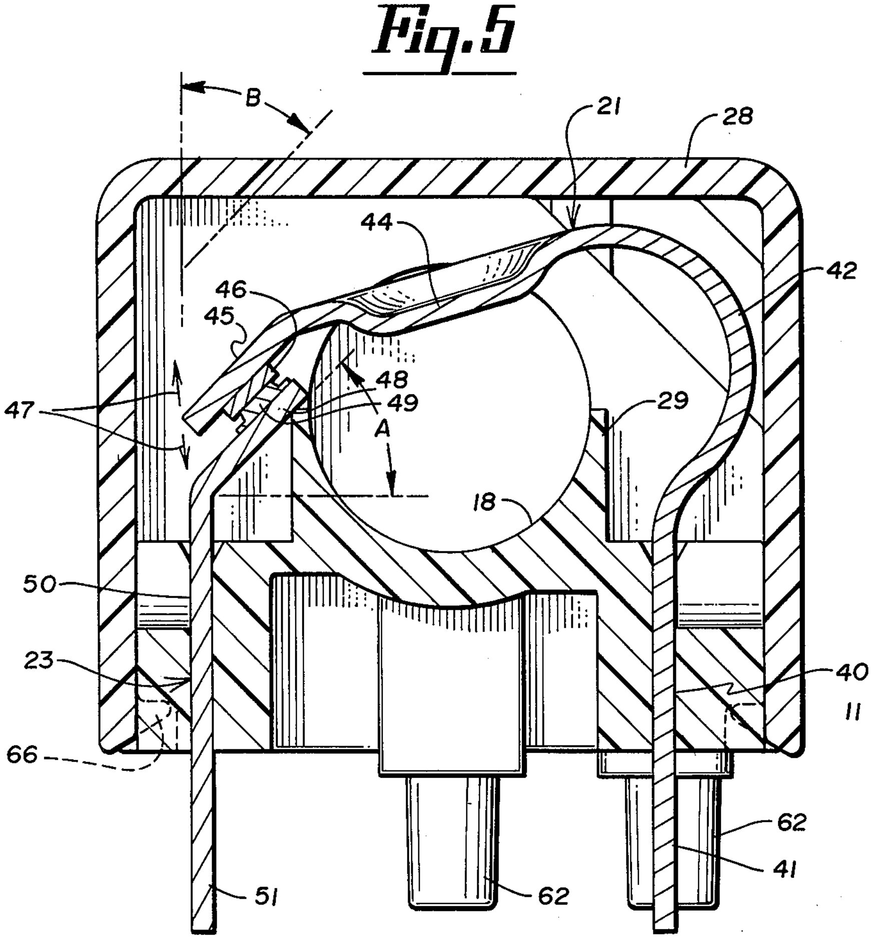
FIG. 5 is a sectional view of the jack of the present invention as viewed along the section line 5—5 of FIG. 2.

The specific construction of the movable spring contact element 21 and its corresponding stationary element 23, and the relationship between them, is illustrated best in FIGS. 1 and 5. As shown, the movable element 21 is mounted in a cantilevered manner with respect to the base 11. The spring contact member 21 includes a barbed shaft portion 40 adapted for insertion into one of the elongated slots 26 on one side of the base 11. The barbs 25 are suitably bent and sized to hold the contact members 21 firmly in place within the base 11. A circuit board contacting lug 41 is integrally formed with one end of the shaft portion 40 and extends below the surface of the jack base 11 for electrical connection with an appropriate female lug receiving receptacle (not shown). A curved portion 42 extends upwardly and outwardly from the section 40 as shown in FIG. 5 and is integrally joined at its other end by an elongated ribbed plug contact portion 44. In the preferred embodiment, the curved portion 42 has a constant radius of curvature through a substantial portion of its curvature and is designed to provide sufficient contact force, while at the same time providing sufficient elasticity and avoiding overstressing of the spring element. The ribbed contact portion 44 extends across a portion of the cylindrical opening 18 to contact the ring portion of the plug when inserted. The rib of portion 44 provides rigidity and insures better electrical contact with the plug.

A contact or free end 45 is integrally joined with an end of the ribbed section 44. This contact end 45 includes a contact surface which, in the preferred embodiment, comprises a cross bar contact element 46. The free end 45 is movable between a first and second position in response to insertion and removal of the plug member 39, respectively. The contact end 45 and corresponding contact surface 46 are disposed at an angle approximately equivalent to the angle of the contact or free end of the stationary contact member 23 and corresponding cross bar contact element 49. As shown in FIG. 5, lower face of the contact member 46 is designed for appropriate electrical connection with the corresponding cross bar contact element 49 on the upper face of the contact end 48. As illustrated in FIG. 1, the cross bar contact member 49 is wider than it is long, whereas the cross bar contact member 46 is longer than it is wide. This particular relationship provides greater tolerances in making electrical contact between the two members. In the preferred embodiment, the bar contacts 46 and 49 have a nickel base and a contact surface which may be constructed of a palladium or gold alloy or other highly conductive material. The palladium or gold alloys are particulary good in that they both provide good conductivity and corrosion resistance.

Upon insertion of the plug member 39 (FIG. 3) into the opening 18, the ribbed portion 44 is contacted by a portion of the plug causing generally upward movement of the contact end 45. This movement of the contact end 45 is shown in FIG. 5 by the directional arrows 47.

The contact end 48 is integrally formed with the main body portion of the stationary contact member 23 and is mounted in a cantilevered manner with respect to the base 11. As shown in FIG. 5, the end 48, and thus the contact surface 49, are disposed at an angle "A" with respect to the horizontal and at an angle "B" with respect to the generally linear movement of the contact end 45. The existence and magnitude of these angles "A" and "B" which, in the preferred embodiment, are complementary angles, are particularly important in increasing the wiping action during the opening and closing of the cross bar contact members 46 and 49 and in insuring sufficient contact force. As illustrated by the directional arrows 47 in FIG. 5, the movement of the contact end 45, when making or breaking electrical contact with the end 48, is generally vertical as a result of the pivoting about a point where the shaft portion 40 joins the curved portion 42. Because the contact end 48 is disposed at an angle with respect to this vertical movement and because the end 48 has some resiliency or flexibility due to its cantilevered mounting, a slight relative sliding movement occurs between the cross bar contact members 46 and 49 when contact is made or broken. This relative sliding action reduces surface contamination which may build up on the contact faces of the elements 46 and 49 by actually rubbing through it or scraping it off. Such surface contamination may occur as the result of oxidation or as a result of particulate matter being present on such surfaces. By increasing this wiping action, the reliability of the electrical contact is improved.

Although the exact magnitude of the angles "A" and "B" is not critical, angle "A" must be sufficiently large (and angle "B" sufficiently small) to allow relative sliding movement between the bar cross bar contact members 46 and 49 when electrical contact is made. On the other hand, angle "A" must not be so large (and angle "B" not so small) as to preclude sufficient electrical contact force exerted by the movable spring member 21. As can be noted in FIG. 5, if the angle "A" increases to the point where it approaches 90° (and angle "B" approaches 0°), the wiping action, or relative sliding movement, between the cross bar contact members 46 and 49 will be increased accordingly, but the contact force resulting from the generally vertical movement of the end 45 would be decreased, thereby reducing the chances of good electrical contact. On the other hand, if angle "A" approaches 0° (and angle "B" approaches 90°), as in the British Pat. No. 974,786, the contact force is increased, but the relative sliding movement, and thus the wiping action is minimal. The inventor has determined that in order to provide sufficient wiping contact as well as sufficient contact force, the angle "A" should be at least about 10°-15°, but no more than about 75°-80°. Preferably, such angle should be approximately between 50°-55°. Similarly, angle "B" should be at least about 10°-15°, but no more than about 75°-80° and preferably between about 35°-40°.

A further structural feature of the stationary contact member 23 which increases the wiping action is its slight resiliency or flexibility. As illustrated in FIG. 5, the contact end 48 is disposed at an angle "A" with respect to the main shaft portion 50 of the contact member 23 and spaced above the base 11. As a result of this "cantilevered" association between the contact end 48 and the main shaft portion of the member 23, slight movement of the end 48, and thereby relative movement between the contacts 46 and 49, occurs when electrical contact is made or broken.

The stationary contact member 23, like the movable contact member 21, includes a body or shaft portion 50 with a plurality of barbs 25 (FIG. 1) adapted for wedged retention within the slots or openings 26. The slots 26 include an opening 27 in the side wall of the base 11 to aid in wedge fitting the contact members within slots 26. Each of the openings has a rounded base to reduce breakage. A printed circuit board contact lug 51 is integrally joined with the shaft portion 50 and extends below the base 11 for electrical connection with a printed circuit board.

With reference again to FIG. 1, it can be seen that the movable contact element or spring 20 is identical in construction to the movable contact 21. The spring contact 20 includes a shaft portion and barbs 25 for retaining the spring 20 in one of the slots 26 in the base 11 in a contilevered manner. A printed circuit board contact lug 52 integrally formed with this shaft portion extends below the lower face of the base 11 for appropriate electrical connection to the printed circuit board. In the preferred embodiment, the contact member 20 does not have a corresponding stationary contact member since there is no need for one in the communications industry. However, if other applications of the jack do require a corresponding stationary contact member, the base 11 can be easily modified to accept such a member.

The tip contact assembly consists of the movable spring contact 22 and the stationary spring contact 24. The stationary contact 24 is identical to the element 23 in that it includes a shaft or body portion with a plurality of barbs 25 for retention in one of the slots 26, a printed circuit contacting lug 54 and a contact end 55 with an appropriate cross bar contact. The movable spring contact 22 is similar in several respects to the movable contact element 21. For example, the contact 22 includes a body or shaft portion with a plurality of barbs 25 for retaining the same within the base 11 and a printed circuit board contact lug 56 adapted to extend below the base 11 for electrical connection with a printed circuit board. The member 22 also includes a curved portion extending upwardly and outwardly from the main body section, an elongated section 59 extending from the curved portion and a contact end 60. The lower surface of the end 60 includes a cross bar contact for electrical engagement with the corresponding cross bar contact on the contact end 55. In addition, the movable contact spring 22 includes a tip contact portion comprising the generally V-shaped element 61 integrally formed with the elongated section 59 and extending forwardly and downwardly with respect to such elongated portion. As illustrated best in FIG. 3, this V-shaped portion 61 is adapted for making electrical contact with the tip portion 38 of the plug 39 by seating within a generally V-shaped area thereof. The presence of the V-shaped element 61 permits the movable spring contact 22 to be inserted into and retained within the base 11 at approximately the same height as the movable spring members 20 and 21. Without this V-shaped portion 61, the movable spring 22 would have to be lowered substantially in order to make electrical contact with the tip 38, thereby requiring significant design and dimension modification of the contact 22.

Figure 3:
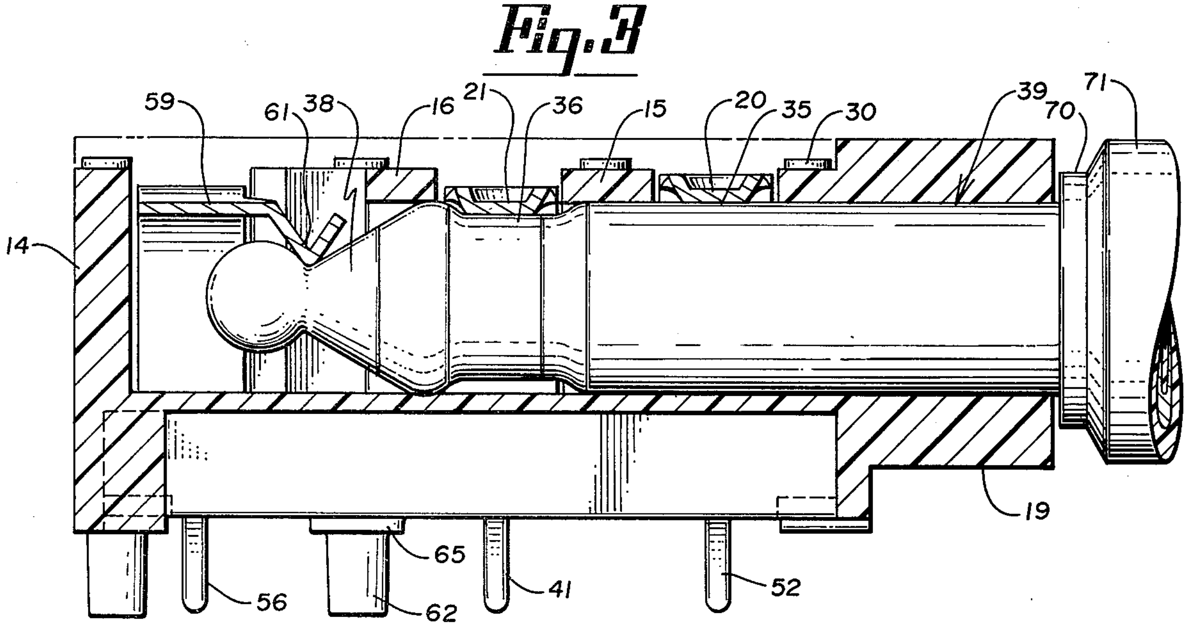
FIG. 3 is a side view, partially in section, of the jack of the present invention with a plug inserted therein.

As shown in FIGS. 2, 3 and 5, the movable contact springs 20, 21 and 22 extend transversely across the jack and are adapted for appropriate engagement with various portions of the plug member 39. Specifically, the V-shaped portion 61 of the movable spring contact 22 is adapted for engagement with the tip portion 38 of the plug, the spring contact 21 is adapted for connection with the ring portion 36 and the contact member 20 is adapted for connection with the sleeve portion 35.

When fully inserted, the plug 39 is retained in the jack as a result of the forces of the spring contact members against the plug and the bottoming of the shoulder portion 70 (FIG. 3) against the sleeve 19. The remainder of the plug is covered by a shell 71 of nonconductive material.

Figure 4:
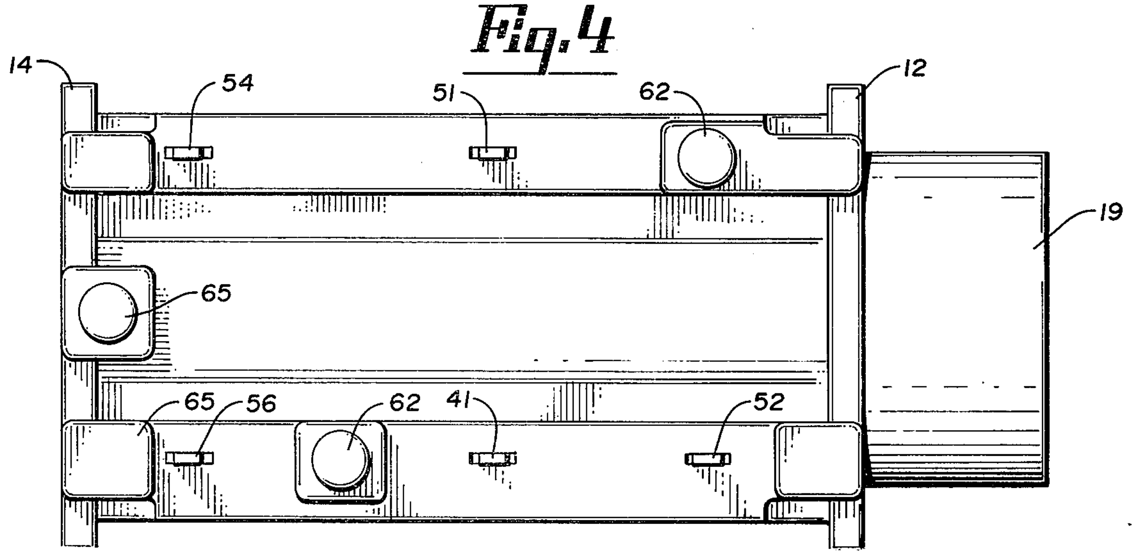
FIG. 4 is a bottom elevational view of the jack of the present invention.
Figure 6:
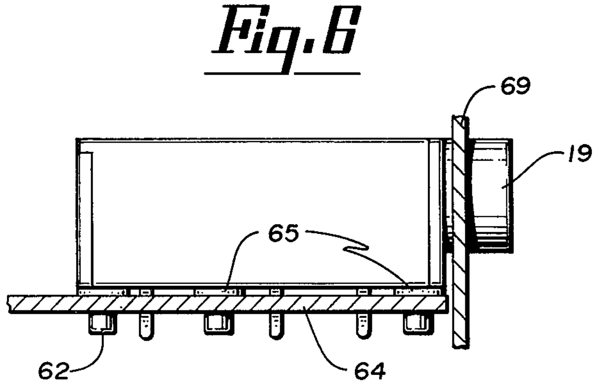
FIG. 6 is a side view of the jack of the present invention mounted to a conventional printed circuit board.

With reference to FIGS. 3, 4, 5 and 6, the lower surface of the base 11 includes a plurality of alignment or stress relief posts 62 integrally formed with the base 11 and adapted for insertion into corresponding openings in the printed circuit board 64 (FIG. 6). These posts 62 serve as stress relief means in resisting the force resulting from insertion of the plug into, and removal of the plug from, the jack. Without such posts, the entire insertion and removal force would be borne by the various printed circuit board contacting lugs. In the preferred embodiment, the openings in the circuit board for reception of the posts 62 are slightly larger than the diameter of the posts 62. This allows for the posts 62 to be heat staked to the circuit board, preventing undesired movement of the jack. The lower surface of the base 11 also includes a plurality of raised shoulder portions or risers 65 allowing the jack to be spaced slightly above the printed circuit board surface. This slight spacing, normally approximately 20/1000 of an inch, permits easier soldering and prevents flux, solder, etc. from collecting on the PCB surface. It should be noted that at least three such shoulder portions 65 must be present in order to sufficiently balance and support the jack. As shown in FIG. 4, several of the risers 65 extend around the base of the stress relief posts 62.

With reference again to FIGS. 1 and 5, it can be seen that the cover portion 28 consists of a three-sided structure having latching tabs 66 positioned at each of its lower corners for appropriate latching engagement with corresponding notches 68 in the base 11. The cover is sized such that it fits within the exterior dimensions of the forward and rearward walls 12 and 14 of the housing 10. A lip portion at the rear of the cover extends over the top of the rear wall 14. The cover is supported by the plurality of posts 30. Installation of the cover 28 does not increase the overall dimensions of the jack.

Figure 7:
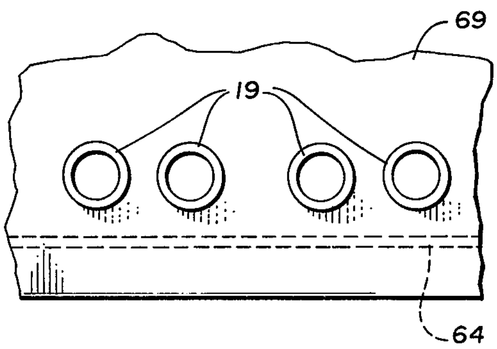
FIG. 7 is a front view of four of the jacks mounted to the front panel of a printed circuit board.

With reference to FIG. 6, it can be seen that the jack is adapted for connection directly to a printed circuit board 64 with the contacting lugs extending into the board 64 for appropriate electrical connection with the printed circuitry. The sleeve portion 19 of the jack extends through a front panel 69. FIG. 7 is a front view of the printed circuit board jack panel showing the normal spacing of two pairs of jacks. In the preferred embodiment, the spacing between jacks within a pair is 0.625 inches.

The operation of the present jack can be described as follows. In its normal position, the movable contact element 21 is in electrical engagement with the element 23, thereby electrically connecting the lugs 41 and 51 (FIG. 5), and the movable contact element is in electrical engagement with the element 24, thereby electrically connecting the lugs 56 and 54 (FIG. 1). When the plug member 39 (FIG. 3) is inserted into the opening 18, portions of the plug 39 engage the ribbed portion of the element 21 and the V-shaped portion 61 of the element 22 raising them and disconnecting the same from their corresponding stationary contact elements 23 and 24. When the plug is fully inserted, the element 20 is electrically connected with the sleeve portion 35, the element 21 is electrically connected with the ring portion 36 and the element 22 is electrically connected with the tip portion 38.

Although the description of the preferred embodiment of the present invention has been quite specific, it is contemplated that various changes and modifications can be made to the structure without deviating from the spirit of the present invention. Therefore, it is intended that the scope of the present invention be dictated by the appended claims rather than by the description of the preferred embodiment.

I claim:

1. An electrical jack suitable for direct connection to a printed circuit board comprising:

an elongated nonconductive housing having a generally cylindrical opening therein along a longitudinal axis for insertion of a plug member;

at least two contact assemblies mounted in said housing extending generally transverse to said cylindrical opening, each of said contact assemblies including a first contact element mounted in a cantilevered manner in said housing and having a portion extending transversely across said cylindrical opening for electrical engagement with a portion of said plug member when inserted therein, said first contact element further including a free end movable between a first and second position in response to insertion and removal of said plug member, respectively, a second contact element mounted in a cantilevered manner in said housing and having a free end, each of the free ends of said first and second contact elements including contact surfaces for electrical engagement with each other when the free end of said first contact element is in its second position, the contact surface of said second contact element being disposed at an angle of at least about 10°–15° but less than about 75°–80° relative to the generally linear movement of the free end of said first contact element between said first and second positions, means for retaining said first and second contact elements in said housing, and means electrically connected with each of said first and second contact elements for direct electrical connection with a printed circuit board.

2. The electrical jack of claim 1 wherein the contact surfaces of said first contact element is disposed at an angle with respect to the generally linear movement of the free end of said first contact element of between about 35° and 40°.

3. The electrical jack of claim 1 having a plurality of stress relief posts integrally formed with said housing and adapted for insertion into the printed circuit board.

4. The electrical jack of claim 3 having at least three spacing elements integrally formed with said housing for spacing said housing with respect to the surface of said printed circuit board.

5. The electrical jack of claim 1 wherein said contact surfaces are electrically connected when the free end of said first contact element is in its second position and electrically disconnected when the free end of said first contact element is in its first position.

6. The electrical jack of claim 1 wherein said means for retaining said first and second contact elements in said housing include a plurality of barbs integrally formed in said elements.

7. The electrical jack of claim 1 wherein said means for electrically connecting said first and second contact elements includes a contact lug integrally formed with each of said contact elements.

8. The electrical jack of claim 1 wherein said first contact element is constructed of a spring material.

9. The electrical jack of claim 1 wherein the contact surface of said first contact element is disposed at approximately the same angle as the contact surface of said second contact element.

10. The electrical jack of claim 9 wherein the contact surfaces of each of said first and second contact elements comprise cross bar contact members.

11. The electrical jack of claim 1 usable with a plug member having tip, ring and sleeve portions.

12. The electrical jack of claim 11 wherein at least one of said first contact elements includes a generally V-shaped contact portion disposed forward of said portion extending across the cylindrical opening for making electrical contact with the tip portion of said plug member.

* * * * *